(12) United States Patent  
Li et al.

(10) Patent No.: US 9,548,270 B2  
(45) Date of Patent: Jan. 17, 2017

(54) ELECTRICAL FUSE WITH METAL LINE MIGRATION

(71) Applicant: INTERNATIONAL BUSINESS MACHINES CORPORATION, Armonk, NY (US)

(72) Inventors: Baozhen Li, South Burlington, VT (US); Yan Zun Li, Lagrangeville, NY (US); Keith Kwong Hon Wong, Wappingers Falls, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/854,770

(22) Filed: Sep. 15, 2015

(65) Prior Publication Data

US 2016/0005690 A1    Jan. 7, 2016

Related U.S. Application Data

(62) Division of application No. 13/234,205, filed on Sep. 16, 2011.

(51) Int. Cl.
    *H01L 21/326*      (2006.01)
    *H01L 23/525*      (2006.01)

(52) U.S. Cl.
    CPC ......... *H01L 23/5256* (2013.01); *H01L 21/326* (2013.01); *H01L 2924/0002* (2013.01)

(58) Field of Classification Search
    CPC ........................... H01L 21/326; H01L 23/5256

USPC .......................................................... 438/132  
See application file for complete search history.

(56) References Cited

U.S. PATENT DOCUMENTS

| | | | |
|---|---|---|---|
| 4,227,168 A | 10/1980 | Knapp, Jr. | |
| 4,228,417 A | 10/1980 | Belcher | |
| 4,240,058 A | 12/1980 | Kozacka et al. | |
| 4,245,208 A | 1/1981 | Belcher | |
| 4,254,394 A | 3/1981 | Kozacka et al. | |
| 4,272,752 A | 6/1981 | Jacobs, Jr. | |
| 4,306,212 A | 12/1981 | Belcher | |
| 6,300,233 B1 | 10/2001 | Lee et al. | |

(Continued)

FOREIGN PATENT DOCUMENTS

| | | |
|---|---|---|
| CN | 101752344 A | 6/2010 |
| KR | 20100138058 A | 12/2010 |

*Primary Examiner* — Bradley K Smith  
(74) *Attorney, Agent, or Firm* — Tutunjian & Bitetto, P.C.; Steven Meyers

(57) ABSTRACT

An electrical fuse device is disclosed. A circuit apparatus can include the fuse device, a first circuit element and a second circuit element. The fuse includes a first contact that has a first electromigration resistance, a second contact that has a second electromigration resistance and a metal line, which is coupled to the first contact and to the second contact, that has a third electromigration resistance that is lower than the second electromigration resistance. The first circuit element is coupled to the first contact and the second circuit element coupled to the second contact. The fuse is configured to conduct a programming current from the first contact to the second contact through the metal line. Further, the programming current causes the metal line to electromigrate away from the second contact to electrically isolate the second circuit element from the first circuit element.

6 Claims, 10 Drawing Sheets

(56) References Cited

U.S. PATENT DOCUMENTS

| | | |
|---|---|---|
| 6,754,135 B2 | 6/2004 | Pilo |
| 6,897,543 B1 | 5/2005 | Huang et al. |
| 6,998,865 B2 | 2/2006 | Bard et al. |
| 7,009,275 B2 | 3/2006 | Herner et al. |
| 7,157,782 B1 | 1/2007 | Shih et al. |
| 7,272,067 B1 | 9/2007 | Huang et al. |
| 2007/0063313 A1* | 3/2007 | Barth .................. H01L 23/5256 257/529 |
| 2009/0200578 A1 | 8/2009 | Xu |
| 2010/0090751 A1 | 4/2010 | Cheng et al. |
| 2010/0133649 A1* | 6/2010 | Lin .................... H01L 23/5256 257/529 |
| 2010/0308953 A1 | 12/2010 | Kim |
| 2010/0327400 A1 | 12/2010 | Choi et al. |
| 2011/0156858 A1* | 6/2011 | Poppe .................... G11C 17/16 337/414 |
| 2013/0063175 A1* | 3/2013 | Lin .................... H01L 23/5256 324/762.01 |

\* cited by examiner

US 9,548,270 B2

ELECTRICAL FUSE WITH METAL LINE MIGRATION

BACKGROUND

Technical Field

The present invention relates to electrical devices, and more particularly, to electrical fuses.

Description of the Related Art

During the development of semiconductor technology, fuses have been incorporated in integrated circuits (ICs) to permit design flexibility and to improve yield. For example, fuses can be employed to selectively de-activate portions of a generic integrated circuit (IC) and thereby tailor the circuit to suit particular design needs. Further, fuses can also be utilized in an IC fabricated with redundant elements to permit the isolation and replacement of defective components of the circuit. Common fuse programming or "blow" techniques involve melting components of the fuse or severing components through the use of a laser. In addition, many fuses utilize geometric manipulation to implement programming. For example, dog-bone or dumb-bell shaped fuses effect programming through current density divergence, where current density is maximized in a small cross-sectional area in the bridge of the device to sever the connection. However, current density divergence can be further leveraged with other more complex shapes, such as multi-tier fuses.

SUMMARY

One embodiment is directed to a circuit apparatus. The circuit apparatus includes a fuse, a first circuit element and a second circuit element. The fuse includes a first contact that has a first electromigration resistance, a second contact that has a second electromigration resistance and a metal line, which is coupled to the first contact and to the second contact, that has a third electromigration resistance that is lower than the second electromigration resistance. The first circuit element is coupled to the first contact and the second circuit element coupled to the second contact. The fuse is configured to conduct a programming current from the first contact to the second contact through the metal line. Further, the programming current causes the metal line to electromigrate away from the second contact to electrically isolate the second circuit element from the first circuit element.

An alternative embodiment is directed to an electric fuse device including a first contact that has a first electromigration resistance, a second contact that has a second electromigration resistance and a metal line that has a third electromigration resistance that is lower than the second electromigration resistance. The metal line is coupled to the first contact and to the second contact. Further, the device is configured to conduct a programming current from the first contact to the second contact through the metal line, where the programming current causes the metal line to electromigrate away from the second contact to program the device.

Another embodiment is directed to a method for programming an electrical fuse device. In accordance with the method, a cathode element is coupled to a contact that is connected to a metal line. In addition, an anode element is coupled to the metal line. Further, the anode and cathode elements are activated to apply a programming current through the contact and the metal line such that the metal line electromigrates away from the contact as a result of the activation.

An alternative embodiment is directed to a method for fabricating a fuse device. The method includes forming a first contact in a first aperture of an insulator and a second contact in a second aperture of the insulator. In addition, a metal line is formed over the insulator, the first contact and the second contact. A cathode element is coupled to the second contact and an anode element is coupled to the first contact such that activating the anode and cathode elements applies a programming current through the metal line such that the metal line electromigrates away from the second contact as a result of the activation.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION

Figure 1:
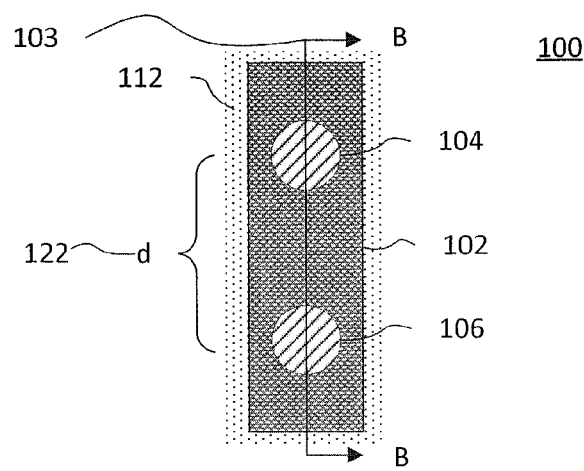
FIGS. 1-2 are cross-sectional views of an electrical fuse device in accordance with an embodiment of the present principles.

In the embodiments described herein, fuses that have a substantially high degree of controllability and programming efficiency can be fabricated and implemented in a simple and economical manner. In particular, complex geometrical manipulation need not be utilized to achieve controllability and programming efficiency benefits, as embodiments described herein need not rely on such current density divergence to effect programming of a fuse. For example, as described in more detail herein below, contacts that have a higher electromigration resistance than a metal line fuse element can be employed in a way that effects migration of the metal line away from a contact to program the fuse. Specifically, these electromigration effects can be achieved without dependence of current density divergence provided by geometric manipulation. Thus, fuse elements in accordance with the present principles can be fabricated simultaneously with other circuit elements without the addition of processing steps, such as the application of additional photoresist masks or etching steps.

Moreover, the programming of fuse embodiments can be achieved without using lasers or melting components of the fuse. As noted above, electromigration effects can be employed to migrate a metal line fuse element from a contact of the fuse. The electromigration in accordance with the present principles can be implemented using much less energy than melting and much better reproducibility, i.e. programming yield. Furthermore, as compared to melting, the electromigration of the metal line has a substantially lower chance of causing physical damage to surrounding circuit elements.

As will be appreciated by one skilled in the art, aspects of the present invention may be embodied as a system, method, device or apparatus. Aspects of the present invention are described below with reference to flowchart illustrations and/or block diagrams of methods, apparatus (systems) and devices according to embodiments of the invention. The flowchart and block diagrams in the Figures illustrate the architecture, functionality, and operation of possible implementations of systems, methods, devices and apparatuses according to various embodiments of the present invention. It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

It is to be understood that the present invention will be described in terms of a given illustrative architecture having a substrate; however, other architectures, structures, substrate materials and process features and steps may be varied within the scope of the present invention.

It will also be understood that when an element described as a layer, region or substrate is referred to as being "on," "above" or "over" another element, it can be directly on the other element or intervening elements may also be present. In contrast, when an element is referred to as being "directly on," "directly above" or "directly over" another element, there are no intervening elements present. Similarly, it will also be understood that when an element described as a layer, region or substrate is referred to as being "beneath" or "below" another element, it can be directly beneath the other element or intervening elements may also be present. In contrast, when an element is referred to as being "directly beneath" or "directly below" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip including fuse devices of the present principles may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 2:
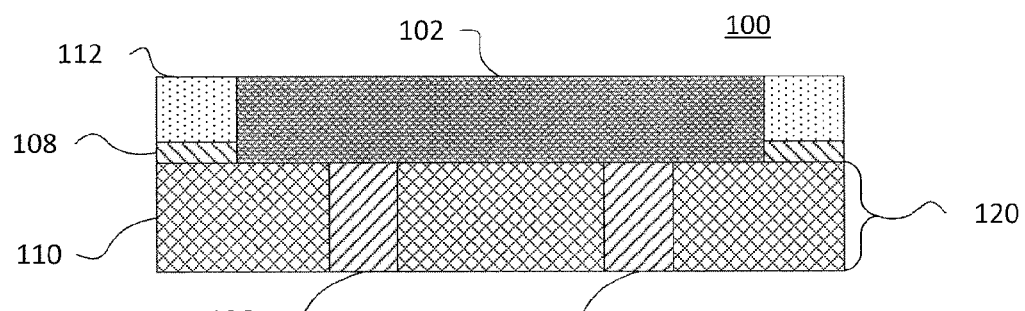

Referring now to the drawings in which like numerals represent the same or similar elements and initially to FIGS. 1 and 2, an exemplary fuse device 100 in accordance with one exemplary embodiment is illustratively depicted. FIG. 1 is a top-down view of the device, while FIG. 2 is a side view of the device along the B-B cross-section 103 of FIG. 1. Although the studs 104, 106 are not viewable from the top-down view of the fuse device 100, for illustrative purposes, the position of the studs 104, 106 are shown in FIG. 1. The fuse device 100 includes a metal line 102, contacts 104 and 106, an insulator material 108 that electrically insulates contacts 104 and 106, an inter-layer dielectric (ILD) 112 and a dielectric cap layer 110. In accordance with one exemplary embodiment, the metal line 102 is copper and the contacts 104, 106 are tungsten. However, the materials for the metal line 102 and the contacts 104, 106 can be chosen such that the electromigration resistance of the metal line 102 is lower than the electromigration resistance of the contacts 104, 106. As described in more detail herein below, the fuse is configured such that the programming of the fuse can be implemented by inducing electromigration of the metal line 102 from a contact. The contacts 106 and 104 can be coupled to different elements of an integrated circuit, where the electrical connection to one of the elements can be severed through programming of the fuse to isolate that element from the rest of the circuit. In accordance with one exemplary aspect, the studs 104-106 can have a height 120 of approximately 30-80 nm and the distance between the two studs 122 (d) can be between 100-200 nm. In addition, the cross-sectional area for the studs 104-106, in the view provided in FIG. 1, can be between about 900 nm$^2$ and about 25,000 nm$^2$. Here, for tungsten contacts, the resistance of the contacts 104, 106 is between 30-100 ohms with a current of about 4 mA and about 7 mA, which would induce programming of the fuse 100. The total resistance of the fuse element is controlled by the distance d 122, which in this example is between 10-20 ohms.

Figure 3:
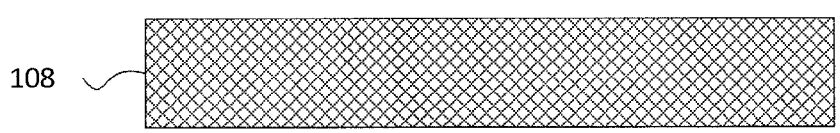
FIGS. 3-8 are cross-sectional views illustrating intermediate processing steps for fabricating an electrical device in accordance with an embodiment of the present principles.
Figure 4:
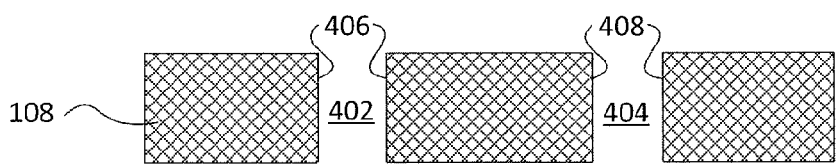
Figure 5:
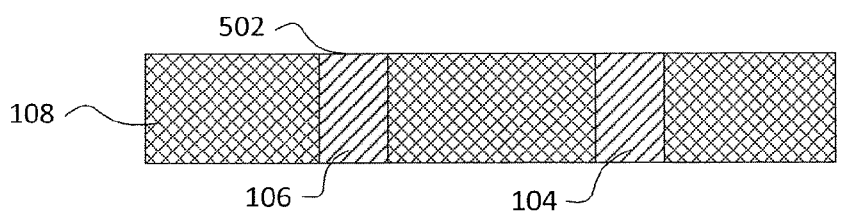
Figure 6:
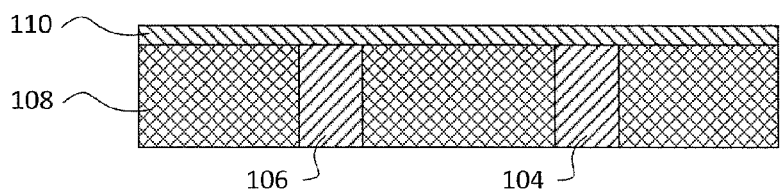
Figure 7:
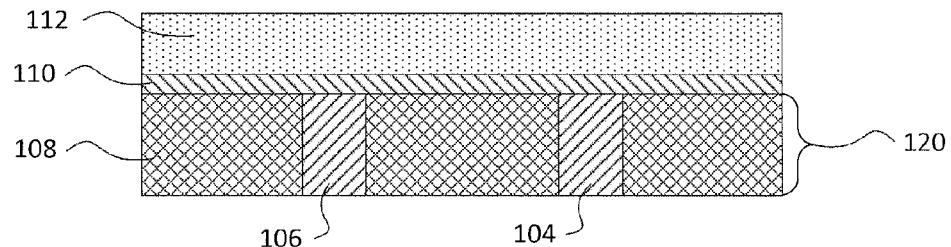
Figure 8:
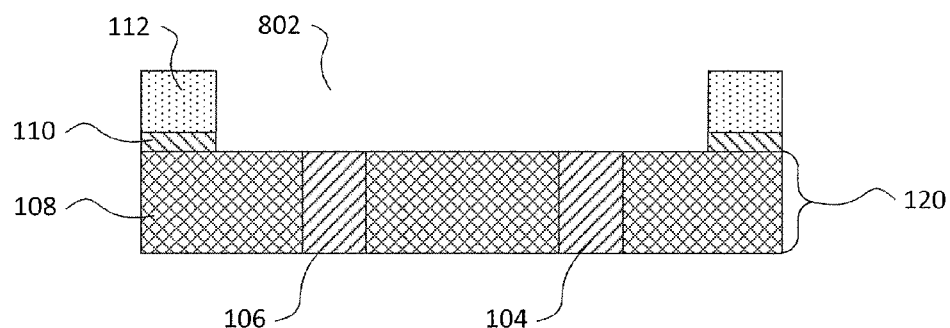

Prior to discussing the programming of the fuse 100 in detail, fabrication of the fuse is described for completeness purposes. Referring to FIGS. 3-8, with continuing reference to FIGS. 1 and 2, an insulator 108 can be deposited on an area of a circuit, above a substrate, on which the fuse 100 will be formed, as illustrated in FIG. 3. For example, the insulator 108 can be silicon dioxide, or any appropriate insulating oxide, and can be deposited using chemical vapor deposition. In addition, as shown in FIG. 4, appropriate photolithography-involved patterning techniques and etching can be applied to form apertures 402 and 404 in which the contacts 106 and 104 will be formed, respectively. Further, a liner, not shown for brevity purposes, such as titanium nitride, can be deposited in accordance with chemical-vapor deposition (CVD) or physical vapor deposition (PVD) techniques along the side walls 406, 408 of the apertures 402 and 404, respectively. As illustrated in FIG. 5, tungsten, or another suitable material, can be deposited in accordance with, for example, CVD techniques, in the apertures 402 and 404 to form contacts 106 and 104, respectively. In addition, the top surface 502 of the resulting structure can be planarized using, for example, chemical-mechanical planarization techniques. Additionally, as shown in FIG. 6, a dielectric cap layer 110, which can be silicon nitride, or another suitable dielectric, can be deposited over the surface 502. As provided in FIG. 7, an inter-layer dielectric material 112 can be deposited on the dielectric cap 110. The dielectric material 112 can be used to isolate the fuse 110 from other fuses and/or other components of an integrated circuit. Photolithographic patterning and etching techniques can be employed, as illustrated in FIG. 8, to form a region 802 in which the metal line 102 can be formed. For example, tantalum nitride liner, not shown for purposes of brevity, can be deposited on the side walls of the aperture 802 in accordance with, for example, PVD techniques. Moreover, electroplating techniques can be employed to form the metal line 102, as illustrated in FIG. 2. Further, chemical mechanical planarization can be applied to the top surface of the resulting structure to ensure proper coupling to any other circuit elements. For example, as described in more detail below, the metal line 102 can be coupled through a via to another layer of a circuit.

Figure 9:
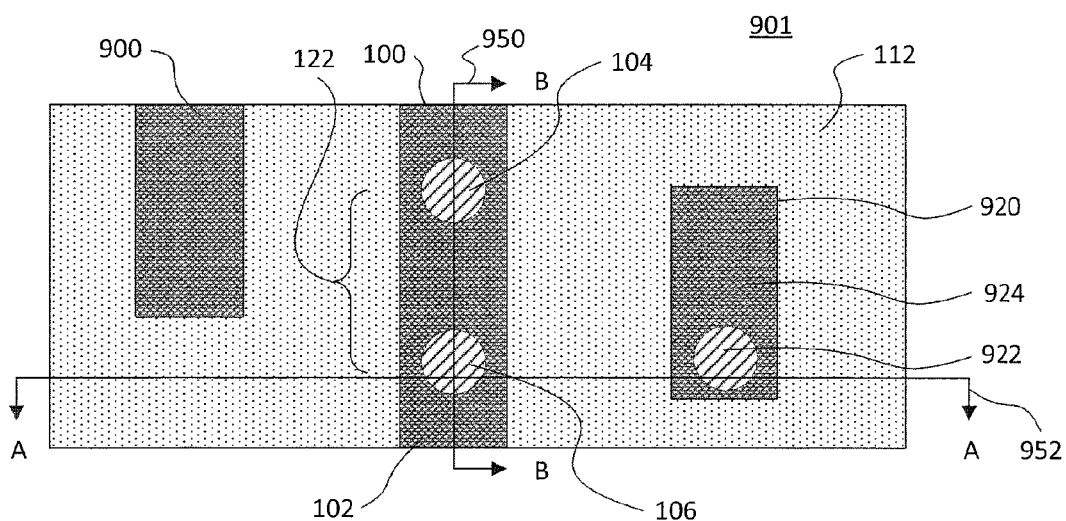
FIGS. 9-11 are cross-sectional views of a portion of a circuit apparatus including an electrical fuse device in accordance with an embodiment the present principles.
Figure 10:
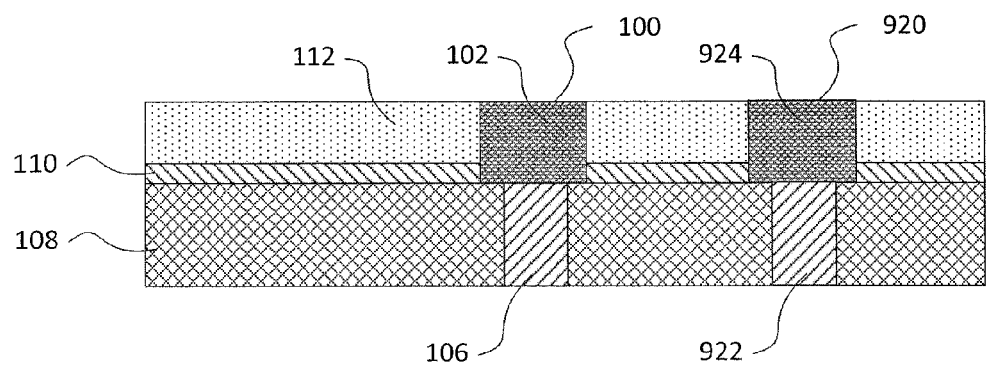
Figure 11:
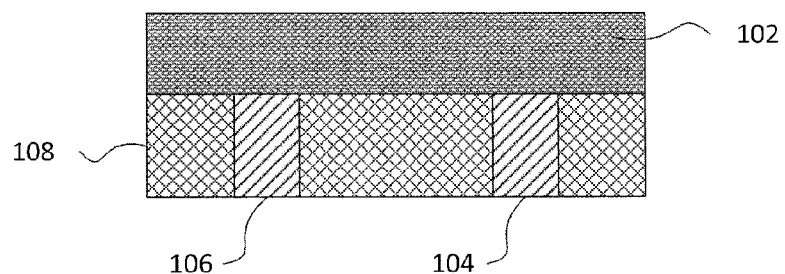

FIGS. 9-11 provide different views of an implementation in which the e-fuse 100 is co-fabricated simultaneously with other components of a circuit. For example, FIG. 9 shows a top-down view of a portion 901 of a circuit including the fuse element 100 and two interconnects 900 and 920. The interconnect 900 is composed of a metal line and the interconnect 920 is composed of a metal line 924 and a contact 922. The metal lines 900 and 924 can also be composed of suitable metals, such as copper. Although the contacts 104, 106 and 922 are not viewable from the top-down view of the fuse device 100, for illustrative purposes, the position of the contacts are shown in FIG. 9. FIG. 10 provides a side view of the portion 901 along the A-A cross-section 952 of FIG. 9, while FIG. 11 provides a side view of the portion 901 along the B-B cross-section 950 of FIG. 9.

Figure 12:
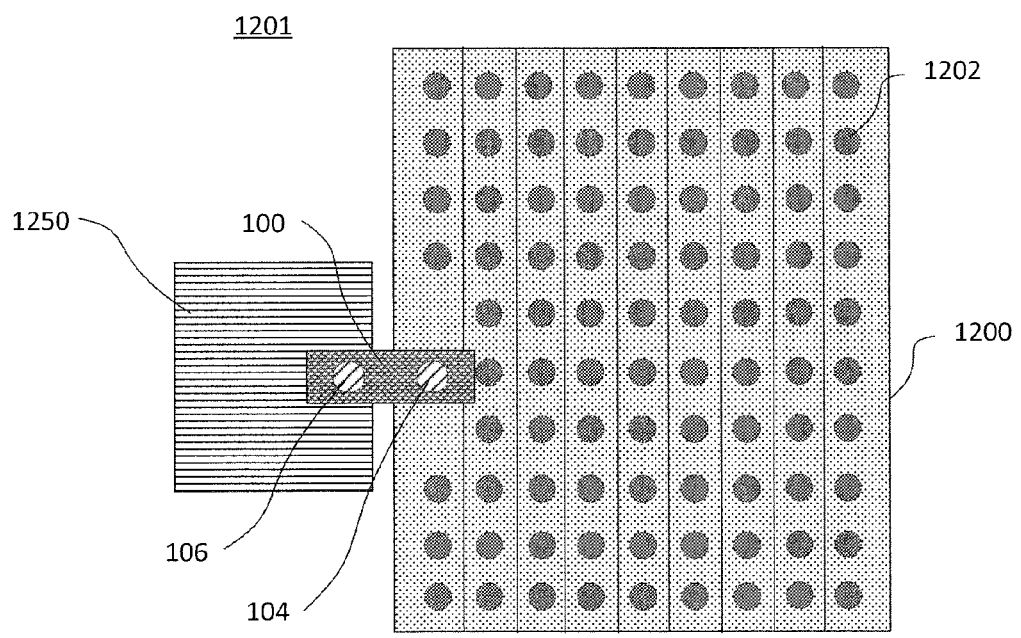
FIG. 12 is a block diagram of a portion of a circuit apparatus in accordance with an embodiment of the present principles.
Figure 13:
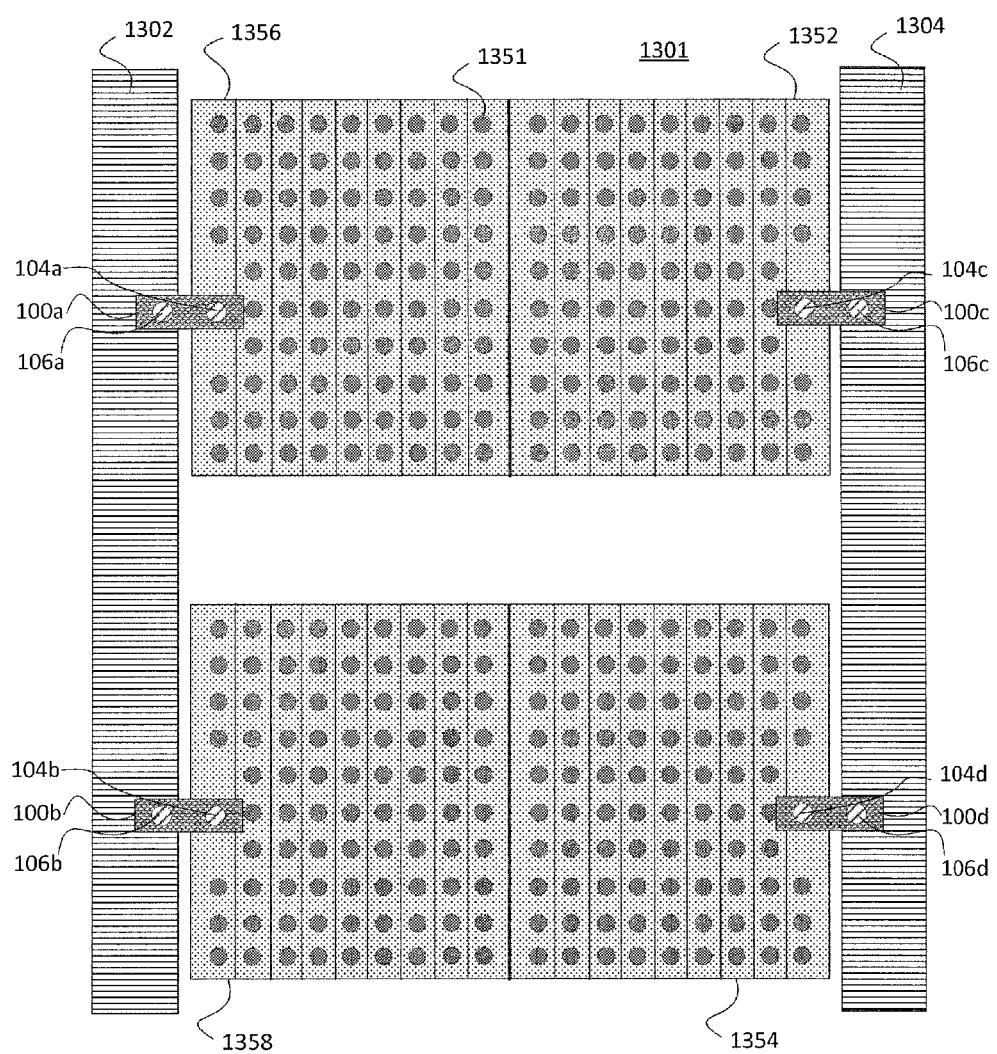
FIG. 13 is a block diagram of a portion of an alternative circuit apparatus in accordance with an embodiment of the present principles.

As indicated above, the e-fuse 100 can be used as a means to isolate one or more components of a circuit upon programming. FIGS. 12 and 13 illustrate how the e-fuse can be implemented in a cell design system 1201 and an array design system 1301, respectively. For example, as depicted in FIG. 12, the e-fuse 100 can be employed to electrically couple a circuit component 1250 with a cell 1200, which can include a plurality of field-effect transistors, as illustrated by contacts 1202 to which connections can be made thereto. As shown in FIG. 13, the e-fuse can also be incorporated in an array design. For example, e-fuses 100a and 100b can couple cells 1356 and 1358 to component 1302, while e-fuses 100c and 100d can couple cells 1352 and 1354 to component 1304. Similar to FIG. 12, each cell 1352-1358 can include a plurality of field-effect transistors, as illustrated by contacts 1351 to which connections can be made thereto. It should be noted that the contacts 104a-d and 106a-d of the e-fuses 100a-d can have a different cross-sectional contact area than the contacts 1202 and 1351. The e-fuses 100, 100a-d can be programmed as described herein below to respectively isolate cells 1200, 1356, 1358, 1352 and 1354 from the rest of their respective integrated circuits.

Figure 14:
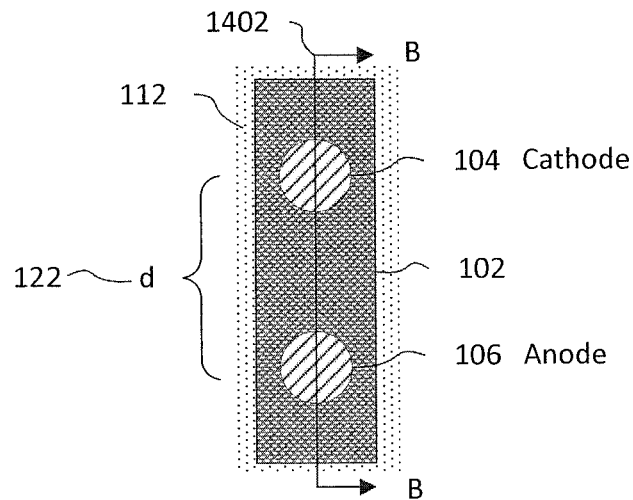
FIGS. 14-15 are cross-sectional views of an electrical fuse device illustrating a programming process in accordance with an embodiment of the present principles.
Figure 15:
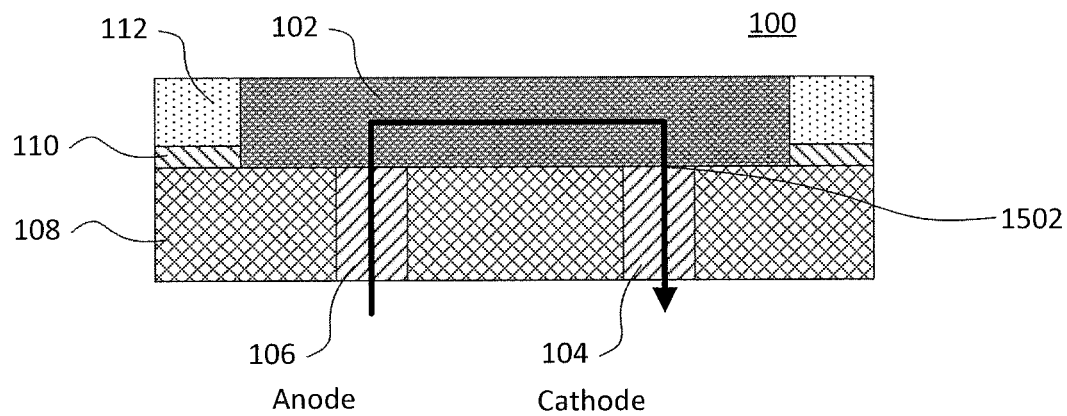

Turning now to FIGS. 14 and 15, block diagrams of the e-fuse 100 illustrating how the fuse can be programmed in accordance with one implementation are provided. FIG. 14 depicts a top-down view of the fuse-element 100, similar to FIG. 1, while FIG. 15 depicts a side view of the fuse element 100 along the B-B cross-section 1402 of FIG. 14. Here, to program the e-fuse 100, the contacts 104 and 106 are respectively coupled to a cathode and anode of a pre-determined programming potential to generate a programming current that flows from the contact 106 to the contact 104 through the metal line 102. As noted above, the contacts 104 and 106 can be tungsten while the metal line 102 can be copper. In particular, the contacts 104 and 106 can have an electromigration resistance that is higher than the metal line 102. Upon application of the programming current to the e-fuse 100, electrons are forced into the metal line 102 through the contacts 104 and 106, thereby causing electromigration of the metal line 102 away from the contact 104 (cathode) towards the anode 106 to create a physical void between the metal line 102 and the contact 104 and break the electrical connection of the fuse. The difference of electromigration resistance between the contacts and the metal line ensures that programming occurs at the contact-metal line interface 1502. Thus, in one embodiment in which the metal line 102 is copper and the contacts 104 and 106 are tungsten, copper atoms are migrated away from the contact 104 upon application of the programming current. As noted above, if the resistance of the tungsten contacts 104, 106 is between about 30 ohms and about 100 ohms, a programming current of about 4 mA and about 7 mA would induce programming of the fuse 100.

In contrast to fuses that rely on geometric manipulation, there is no electron current diversion in the fuse element embodiment 100. Furthermore, also contrary to fuses that incorporate geometric manipulation, additional lithography masking and etching steps need not be added to the circuit fabrication process. As such, because the e-fuse 100 need not rely on current density divergence, the formation of the fuse in integrated circuits that are increasingly fabricated on smaller scales is substantially facilitated. Moreover, the programming of the fuse 100 need not involve melting of any components. Thus, the programming described herein utilizes less energy, reduces the likelihood of physical damage to nearby circuit elements and, as a result, is more reliable and provides a fuse with a longer service life than fuses that rely on melting for programming.

In addition, the configuration of the fuse and the programming process provides further advantages for fuses that incorporate contacts that have a higher electromigration resistance than the metal line. For example, referring again to the tungsten contacts and copper line example, an alternative configuration may use the tungsten contact as the fuse element by situating the cathode at the metal line and the anode below the contact. However, tungsten is a very heavy metal and uses an excessive amount of energy for migration. Further, the migration of the tungsten in this alternative configuration has a relatively low consistency. In contrast, the programming described here with respect to FIGS. 14 and 15 uses the copper line as the fuse element and exploits the electromigration resistivity difference to migrate the copper that is in contact with tungsten and thereby create an electrical discontinuity with less energy and greater consistency.

In accordance with other advantageous aspects, optional local heating of the metal line by the contacts 102 and 104 can accelerate the programming process by providing a migration-enhancing thermal environment for the metal line. The optional additional assist heating is described in more detail herein below with respect to more detailed embodiments of the present principles.

Figure 16:
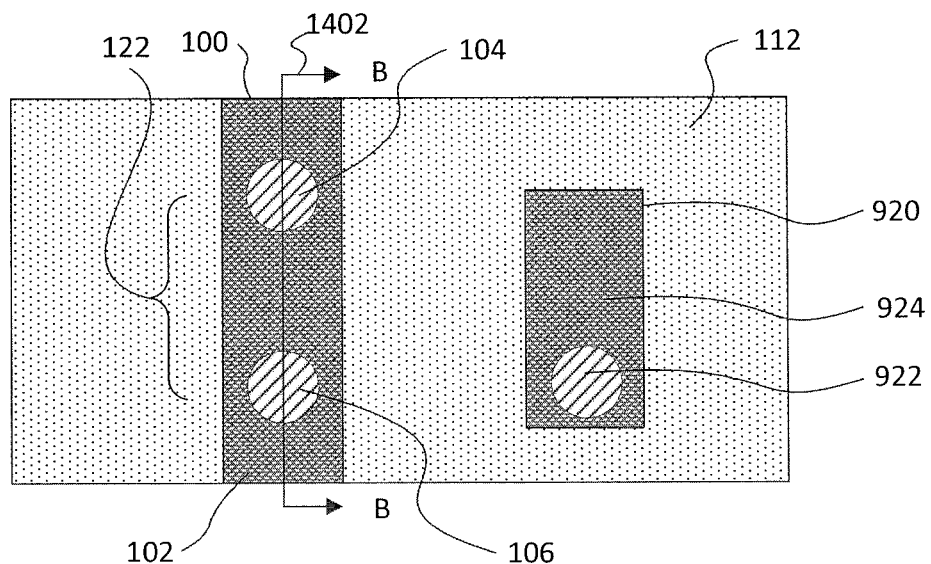
FIGS. 16-17 are cross-sectional views of a portion of a circuit apparatus illustrating a programming process in accordance with an embodiment of the present principles.
Figure 17:
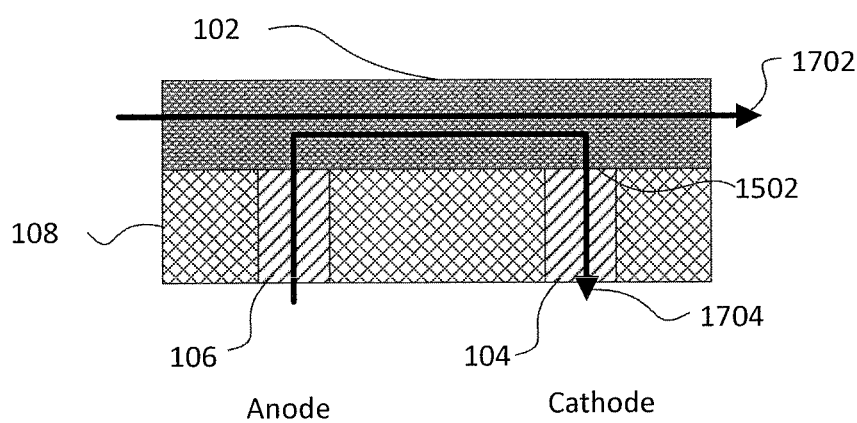

Referring now to FIGS. 16-24, alternative fuse embodiments and programming processes are described. FIGS. 16-17 effectively illustrate the same embodiment described above with respect to FIGS. 14 and 15. FIG. 16 depicts a top-down view of the fuse-element 100, similar to FIG. 1, while FIG. 17 depicts a side view of the fuse element 100 along the B-B cross-section 1402 of FIG. 16. Here, both the interconnects for fuse 100 and element 920 are M1 interconnects and the programming is implemented as described above with respect to FIGS. 14 and 15. For example, the cathode is disposed at contact 104 and the anode is disposed at the contact 106. As the programming current 1704 is applied between the contact 106 and contact 104 through the metal line 102, the metal atoms of the metal line 102 migrate away from the interface 1502 between the contact 104 and the metal line 102 to thereby sever the electrical connection to the contact 104. Arrow 1702 illustrates the direction of the programming current, while arrow 1704 illustrates the flow of the programming current between the contacts 106 and 104 through the metal line 102.

Figure 18:
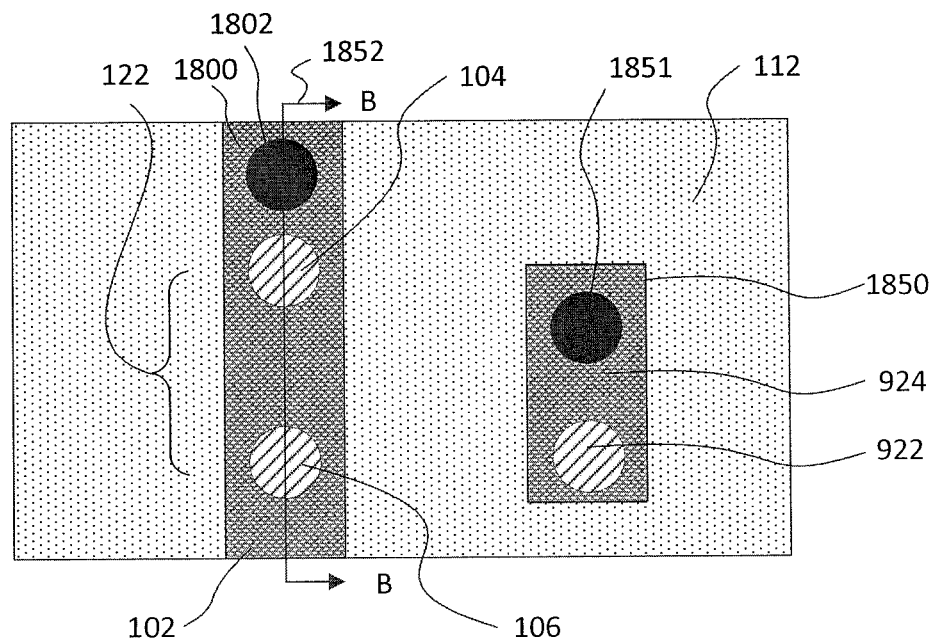
FIGS. 18-19 are cross-sectional views of a portion of a circuit apparatus illustrating a programming process in accordance with an alternative embodiment of the present principles.
Figure 19:
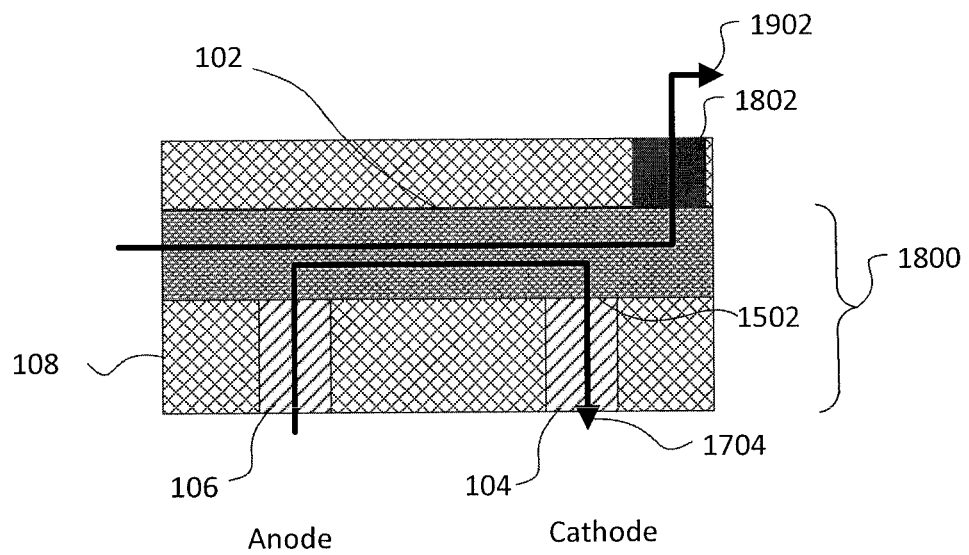
Figure 20:
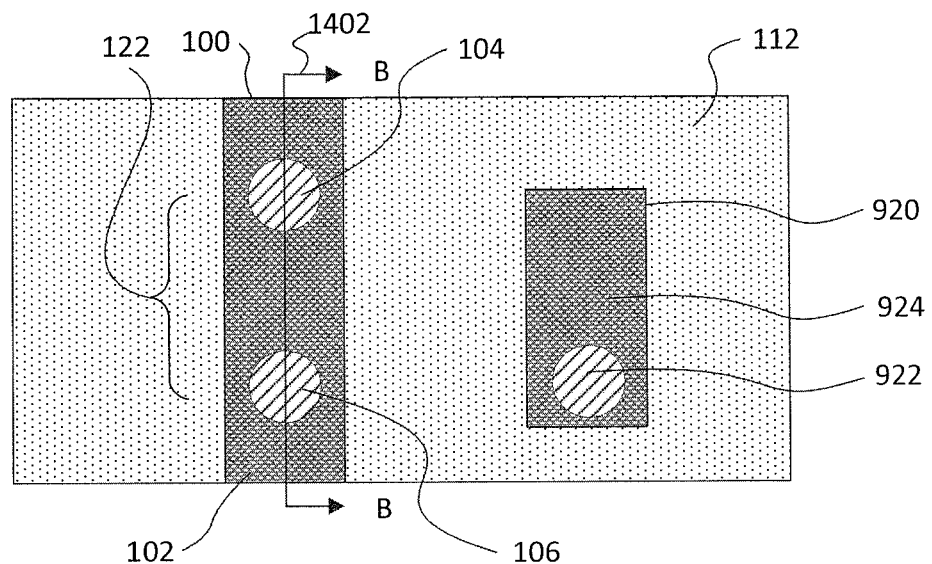
FIGS. 20-21 are cross-sectional views of a portion of a circuit apparatus illustrating a programming process in accordance with an alternative embodiment of the present principles.
Figure 21:
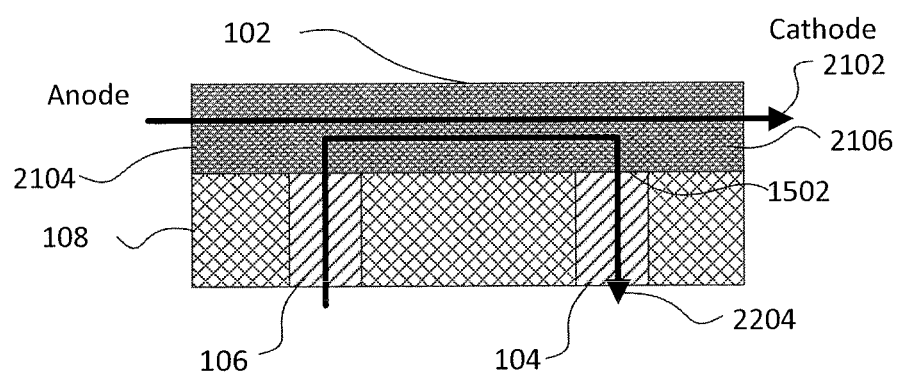
Figure 22:
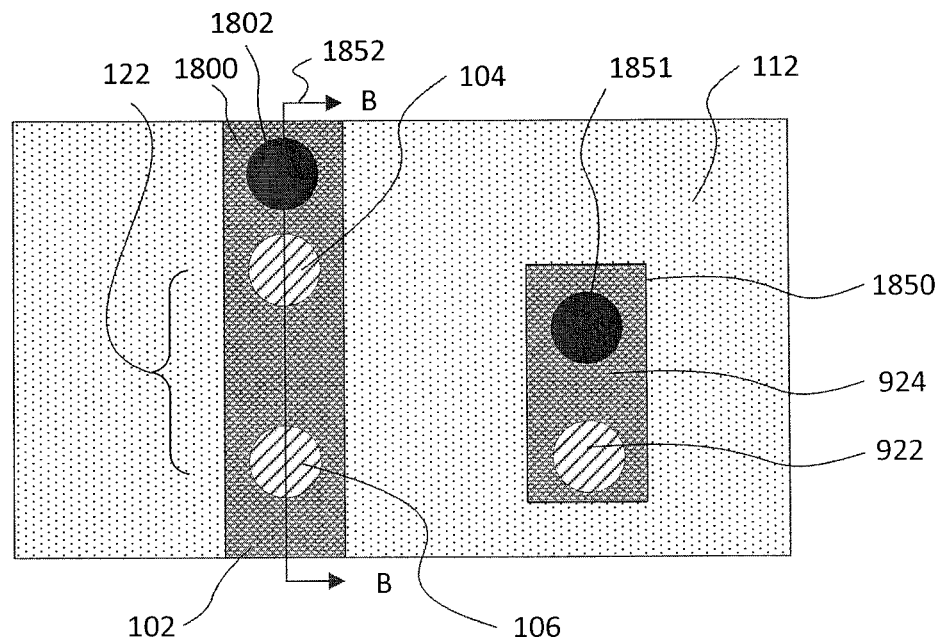
FIGS. 22-23 are cross-sectional views of a portion of a circuit apparatus illustrating a programming process in accordance with an alternative embodiment of the present principles.

FIGS. 18-19 illustrate a fuse in which the programming is similar to that of FIGS. 16 and 17, but the configuration of the interconnects are different. FIG. 18 depicts a top-down view of the fuse-element 1800 and interconnect 1850 at a planar cross section that is at the top of the metal line 102, similar to FIG. 1, while FIG. 19 depicts a side view of the fuse element 1800 along the B-B cross-section 1852 of FIG. 18. Here, the fuse 1800 and the interconnect 1850 are M1 interconnects that are coupled to M2 elements through respective vias 1802 and 1851. Similar to the programming described with respect to FIGS. 14 and 15, the cathode is disposed at the contact 104 and the anode is disposed at the contact 106. As the programming current is applied between the contact 106 and the contact 104 through the metal line 102, the metal atoms of the metal line 102 migrate away from the interface 1502 to sever the electrical connection to the contact 104. Arrow 1902 illustrates the direction of the current flow in the fuse 1800, while arrow 1704 illustrates the flow of the programming current between the contacts 106 and 104 through the metal line 102. Thus, any circuit elements coupled to the fuse 1800 through the contact 104 are electrically isolated from any circuit elements coupled to the fuse through contact 106 and the via 1802 as a result of the programming.

The fuse elements depicted in FIGS. 20-21 and FIGS. 22-23 are essentially the same as the fuse elements depicting in FIGS. 16-17 and FIGS. 18-19, respectively, except for the programming currents applied. In the embodiment illustrated in FIG. 21, an additional programming current 2102 is applied such that an anode is disposed at end 2104 of the fuse 100 and a cathode is disposed at end 2106 of the fuse 100. Similarly, in the embodiment illustrated in FIG. 23, an additional programming current 2302 is applied such that an anode is disposed at end 2104 of the fuse 1800 and a cathode is disposed at the via 1802 of the fuse 1800. In both of the cases depicted in FIGS. 20-21 and FIGS. 22-23, a programming current 2204 is maintained between contact 106 and contact 104 through the metal line 102, as described above with respect to FIGS. 16-17 and FIGS. 18-19. However, here, the combination of the additional programming current 2102, 2302 and the programming current between the contacts 106 and 104 result in electromigration of the metal line from the contact 104, as described above, and an electromigration-enhancing temperature due to heating from the closely situated contacts. The resultant heating provides an environment that is more conducive to electromigration of the metal line 102, thereby improving the consistency and efficiency of the programming of the fuses 100 and 1800.

Figure 23:
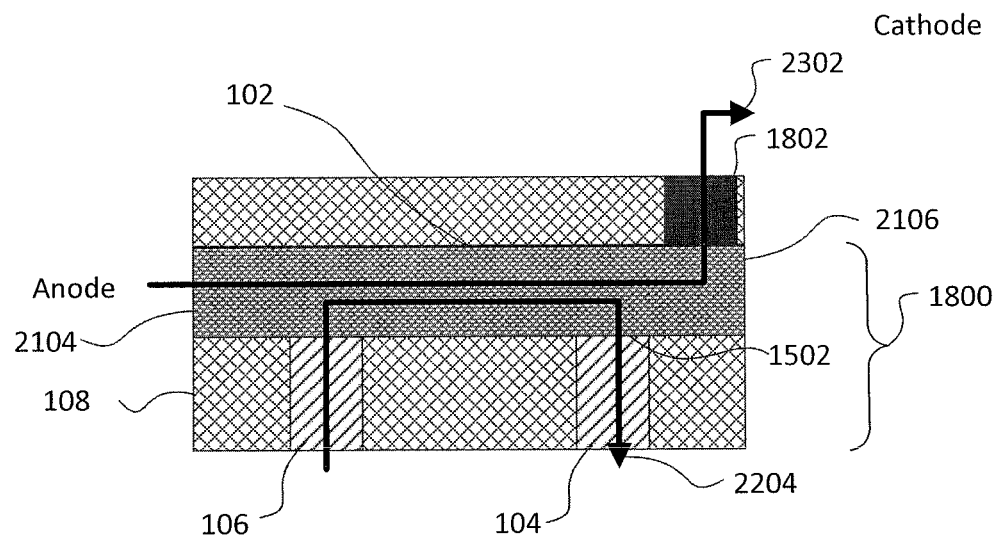
Figure 24:
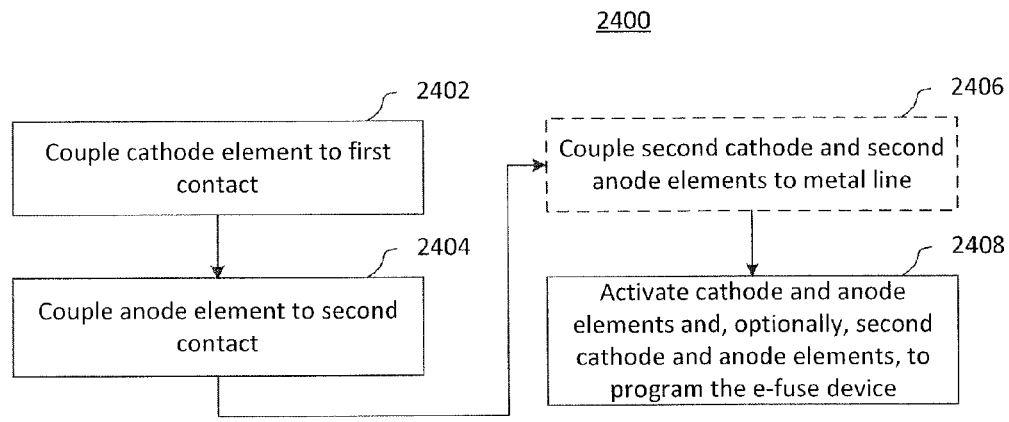
FIG. 24 is a flow diagram of a method for programming an electrical fuse device in accordance with an embodiment of the present principles.

Referring now to FIG. 24, with continuing reference to FIGS. 1-23, a method 2400 for programming an electrical fuse device in accordance with one illustrative embodiment is depicted. It should be noted that the method can be applied to any of the fuse device embodiments described above and in any of the circuit environments described above. The method 2400 can begin at step 2402, at which a cathode element can be coupled to a first contact that is connected to a metal line. For example, as described above with respect to FIGS. 15-23. A cathode element can be coupled to the contact 104. Here, an external pad can be coupled to the contact 104 to act as the cathode in the programming of the fuse. In addition, a circuit element can be coupled to the contact 104. For example, as noted above with respect to FIGS. 12 and 13, the contact 104 can be coupled to circuit elements 1200, 1356, 1358, 1352 or 1354.

At step 2404, an anode element can be coupled to a second contact. For example, as described above with respect to FIGS. 15-23, an anode element can be coupled to the contact 106, which in turn is coupled to the metal line 102. Similar to the cathode element example described above, an external pad can be coupled to the contact 106 to act as the anode in the programming of the fuse. Further, a different circuit element can be coupled to the contact 106. For example, as noted above with respect to FIGS. 12 and 13, the contact 106 can be coupled to circuit elements 1250, 1302 or 1304.

Optionally, at step 2406, a second cathode element and a second anode element can be coupled to a metal line of the fuse element. For example, as described above with respect to FIGS. 21 and 23, an anode element can be coupled to end 2104 of the metal line 102, while a cathode element can be coupled to end 2106 of the metal line 102 as described above with respect to FIG. 21. In addition, as discussed above with respect to FIG. 23, the cathode element can also be coupled to the via 1802, which is connected to a separate level of the circuit apparatus.

At step 2408, the cathode and anode elements, and optionally, the second cathode and anode elements, can be activated to program the electrical fuse device. For example, a predetermined voltage can be applied to the external pads coupled to the contacts 106 and 104 at step 2404. Optionally, a predetermined voltage can be applied to the external pads coupled to the metal line at step 2406. The activation of the cathode and anode can cause the fuse device to conduct a programming current from the contact 106 to the contact 104 through the metal line 102. Further, the programming current can cause the metal line to electromigrate away from the contact 104. The programming of the fuse device in this way can electrically isolate the circuit element coupled to the contact 104 from the other circuit elements. For example, the programming of the fuse device can electrically isolate the circuit element coupled to the contact 104 from the circuit element coupled to the contact 106. In the configuration illustrated in FIG. 12, the programming of the fuse 100 can electrically isolate the element 1200 from the element 1250. Similarly, in the configuration illustrated in FIG. 13, the programming of the fuse 100a can electrically isolate the element 1356 from the element 1302. Moreover, as noted above, if the optional second cathode and anode elements are activated across the metal line 102, a second programming current conducts through the metal line. For example, as noted above with respect to FIGS. 21 and 23, second programming currents 2102 and 2302 can be applied across the metal line 102. Here, as described above with respect to FIGS. 21 and 23, the first programming current 2204 can heat the metal line 102 to aid the electromigration of the metal line 102. For example, in the case in which a copper line is used, the metal line can be heated to a temperature of 40-350° C. As also stated above with respect to FIG. 23, the metal line 102 can be coupled to a via 1802 such that the second programming current flows through the via to a circuit element on a separate level of the circuit apparatus. In this case, the electromigration of the metal line 102 away from the contact 104 isolates the circuit element coupled to the contact 104 from the separate level of the circuit apparatus.

Figure 25:
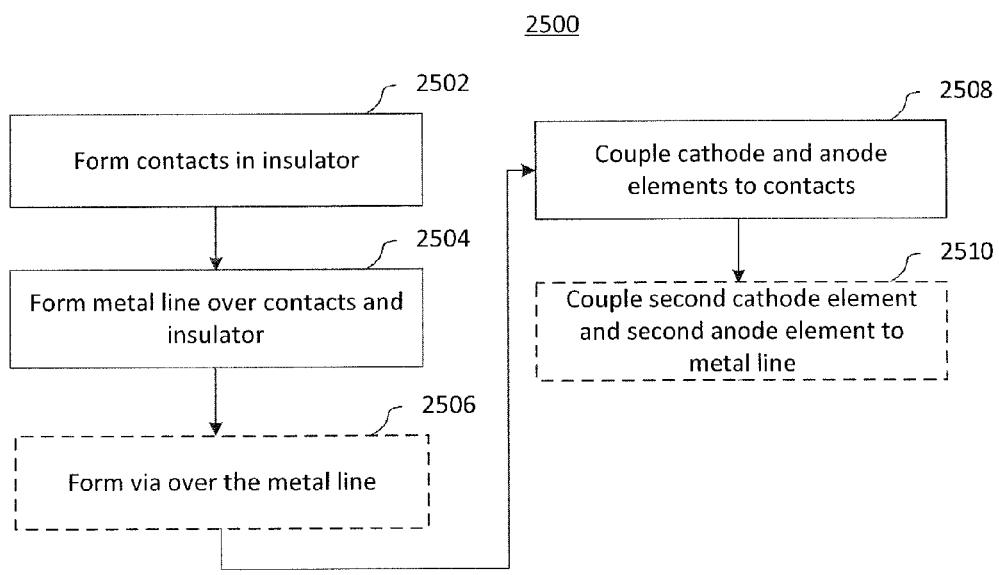
FIG. 25 is a flow diagram of a method for fabricating an electrical fuse device in accordance with an embodiment of the present principles.

Referring now to FIG. 25, with continuing reference to FIGS. 1-24, a method 2500 for fabricating a fuse device in accordance with an exemplary embodiment is illustrated. It should be understood that the method 2500 can be employed to fabricate any one or more of the fuse devices described above. In addition, the programming method 2400 can be applied to a fuse device fabricated in accordance with the method 2500. The method 2500 can begin at step 2502, at which contacts can be formed in an insulator 2502. For example, as described above with respect to FIGS. 3-6, an insulator 108 can be provided and apertures 402 and 404 can be etched. Further, contacts 106 and 104 can be formed within the apertures 402 and 404. As noted above, the contacts 106 and 104 can be tungsten contacts.

At step 2504, a metal line can be formed over the contacts and the insulator. For example, as described above with respect to FIGS. 2 and 5-8, a cap layer 110 and an interlayer dielectric 112 can be formed over the contacts 106 and 104 and the insulator 108. In addition, the layers 110 and 112 can be etched and the metal line 102 can be formed in region 802. The metal line can be connected to other components of a circuit. For example, the metal line can be an integral part of a circuit that is connected to a variety of different elements. As described above, the metal line 102 can be a material that has a lower electromigration resistance than the contacts 106 and 104. For example, if the contacts 106 and 104 are tungsten contacts, then the metal line can be a copper line. Moreover, the thickness of the metal line between the first and second contacts, from any cross-sectional viewing angle, is constant. For example, as illustrated in FIGS. 14 and 15, the thickness of the metal line 102 is constant in both the top view and the side view of the fuse. In contrast, as described above, fuses that rely on geometric manipulations to create a current density divergence will not have a fuse element that has a consistent thickness, from any viewing angle, between an anode and a cathode.

Optionally, at step 2506, a via can be formed over the metal line. For example, as illustrated in FIGS. 19 and 23, a via 1802 can be formed directly over the metal line 102 to couple the metal line to one or more circuit elements to a separate level of a circuit.

At step 2508, a cathode element and an anode element can be coupled to the contacts. For example, the cathode element and the anode element can be coupled to the contacts as described above with respect to steps 2402 and 2404 of the method 2400. For example, the coupling can be made such that activating the anode and cathode elements applies a programming current through the metal line to induce the metal line to electromigrate away from the first contact as a result of the activation. Optionally, at step 2510, a second cathode element and a second anode element can be coupled to the metal line. For example, the second cathode and the second anode elements can be coupled to the metal line as described above with respect to step 2406 of the method 2400. For example, the coupling can be made such that activation of the second cathode element and the second anode element applies a second programming current through the metal line. As indicated above, the programming current applied through the metal line 102 between the contact 106 and the contact 104 can heat the metal line to aid the electromigration of the metal line. Further, if the via is formed at step 2506, the second cathode element can be coupled to the metal line 102 through the via such that the second programming current flows through the via to a separate level of the circuit in which the fuse is fabricated. It should be noted that steps 2508 and 2510 can be respectively implemented as steps 2402-2404 and 2406 of the method 2400 if both of the methods 2500 and 2400 are performed.

Having described preferred embodiments of systems, apparatuses and devices including an electrical fuse with metal line migration and methods of fabrication and programming (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for programming an electrical fuse device comprising:
    coupling a cathode element comprising tungsten to a contact that is connected to a metal line comprised of copper;
    coupling an anode element comprising tungsten to the metal line; and
    activating the anode and cathode elements to apply a programming current ranging from 4 mA to 7 mA through the contact and the metal line such that the metal line electromigrates away from the contact forming an electromigration opening portion of the electrical fuse present in the metal line underlying one of the cathode element and the anode element, wherein each of said cathode element and said anode element have a height ranging from 30 nm to 80 nm.

2. The method of claim 1, wherein a distance between said anode element and said cathode element ranges from 100 nm to 200 nm.

3. The method of claim 2, wherein the contact is a first contact, wherein the coupling the anode element further comprises coupling the anode element to a second contact such that the activating causes the programming current to flow between the second contact and the first contact through the metal line.

4. The method of claim 3, wherein the programming current is a first programming current and wherein the method further comprises:
  coupling a second cathode element and a second anode element to the metal line, wherein the activating comprises activating the second cathode element and the second anode element to apply a second programming current through the metal line, wherein the first programming current heats the metal line to aid the electromigration of the metal line.

5. The method of claim 4, wherein the coupling the second cathode element further comprises coupling the second cathode element to the metal line through a via connected to a separate level of a circuit and wherein the second programming current flows to the separate level through the via.

6. The method of claim 3, wherein a thickness of the metal line between the first and second contacts, from any cross-sectional viewing angle, is constant.

* * * * *